United States Patent
Muschaweck

(10) Patent No.: US 8,172,433 B2
(45) Date of Patent: May 8, 2012

(54) OPTOELECTRONIC COMPONENT AND ILLUMINATION DEVICE

(75) Inventor: Julius Muschaweck, Gauting (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 390 days.

(21) Appl. No.: 12/305,491

(22) PCT Filed: Jun. 28, 2007

(86) PCT No.: PCT/DE2007/001149
§ 371 (c)(1),
(2), (4) Date: Mar. 12, 2009

(87) PCT Pub. No.: WO2008/000244
PCT Pub. Date: Jan. 3, 2008

(65) Prior Publication Data
US 2009/0284951 A1    Nov. 19, 2009

(30) Foreign Application Priority Data
Jun. 30, 2006 (DE) .......................... 10 2006 030 253
Oct. 27, 2006 (DE) .......................... 10 2006 050 880

(51) Int. Cl.
*F21V 5/04* (2006.01)
(52) U.S. Cl. ...... 362/335; 362/340; 362/334; 362/311.1
(58) Field of Classification Search .................. 362/335, 362/334, 336–338, 340, 361, 311.02, 311.06–311.09, 362/311.1, 326–329, 307–309; 257/98, 99; 359/642, 709–712, 853
See application file for complete search history.

(56) References Cited

U.S. PATENT DOCUMENTS

| | | | |
|---|---|---|---|
| 5,924,788 A | 7/1999 | Parkyn, Jr. | |
| 6,273,596 B1 | 8/2001 | Parkyn, Jr. et al. | |
| 6,338,568 B1 * | 1/2002 | Futami | 362/538 |
| 6,761,472 B1 | 7/2004 | Cleaver et al. | |
| 7,345,828 B2 * | 3/2008 | Pawlowski et al. | 359/710 |
| 7,422,347 B2 * | 9/2008 | Miyairi et al. | 362/335 |
| 7,465,074 B2 * | 12/2008 | Blumel | 362/335 |

(Continued)

FOREIGN PATENT DOCUMENTS

CN      169396      11/2005

(Continued)

OTHER PUBLICATIONS

Notification of Transmittal of Translation of the International Preliminary Report on Patentability issued in corresponding International Application No. PCT/DE2007/001149 on Jan. 22, 2009.

(Continued)

*Primary Examiner* — Bao Q Truong
(74) *Attorney, Agent, or Firm* — Fish & Richardson P.C.

(57) ABSTRACT

An optoelectronic component has optically active region, with the optically active region comprising at least one semiconductor chip which is provided for generating electromagnetic radiation, and comprising a beam-forming element through which at least a portion of the electromagnetic radiation which is emitted from the semiconductor chip in operation passes and which has an optical axis, and with the optically active region having quadrant symmetry with respect to a coordinate system which is perpendicular to the optical axis. An illumination device has an optoelectronic component such as this.

34 Claims, 11 Drawing Sheets

U.S. PATENT DOCUMENTS

| | | | |
|---|---|---|---|
| 7,674,018 B2 * | 3/2010 | Holder et al. | 362/311.06 |
| 7,880,188 B2 * | 2/2011 | Blumel et al. | 257/98 |
| 7,942,558 B2 * | 5/2011 | Zweig et al. | 362/311.06 |
| 2002/0024821 A1 | 2/2002 | Yen | |
| 2004/0208020 A1 | 10/2004 | Ishida | |
| 2004/0240203 A1 | 12/2004 | Matsumura et al. | |
| 2004/0264185 A1 | 12/2004 | Grotsch et al. | |
| 2005/0077839 A1 | 4/2005 | Ho | |
| 2005/0151147 A1 | 7/2005 | Izuno | |
| 2005/0243577 A1 | 11/2005 | Moon | |
| 2006/0007553 A1 | 1/2006 | Bogner et al. | |
| 2006/0018010 A1 * | 1/2006 | Blumel | 359/351 |
| 2006/0034097 A1 | 2/2006 | Hahm et al. | |
| 2006/0066218 A1 | 3/2006 | Yamaguchi et al. | |
| 2006/0083023 A1 | 4/2006 | Ayabe et al. | |
| 2006/0091418 A1 | 5/2006 | Chew | |
| 2006/0138437 A1 | 6/2006 | Huang et al. | |

FOREIGN PATENT DOCUMENTS

| | | |
|---|---|---|
| CN | 1698202 | 11/2005 |
| DE | 102004019318 | 11/2004 |
| DE | 102005019278 | 12/2005 |
| DE | 102005035192 | 5/2006 |
| EP | 0 322 069 | 6/1989 |
| EP | 1521235 | 4/2005 |
| EP | 1621918 | 2/2006 |
| EP | 1641052 | 3/2006 |
| EP | 1657758 | 5/2006 |
| JP | 2004/047647 | 2/2004 |
| WO | WO 99/08042 | 2/1999 |
| WO | WO 2004/032235 | 4/2004 |
| WO | WO 2004/097516 | 11/2004 |

OTHER PUBLICATIONS

International Search Report for PCT/DE2007/001149. dated May 30, 2008.

* cited by examiner

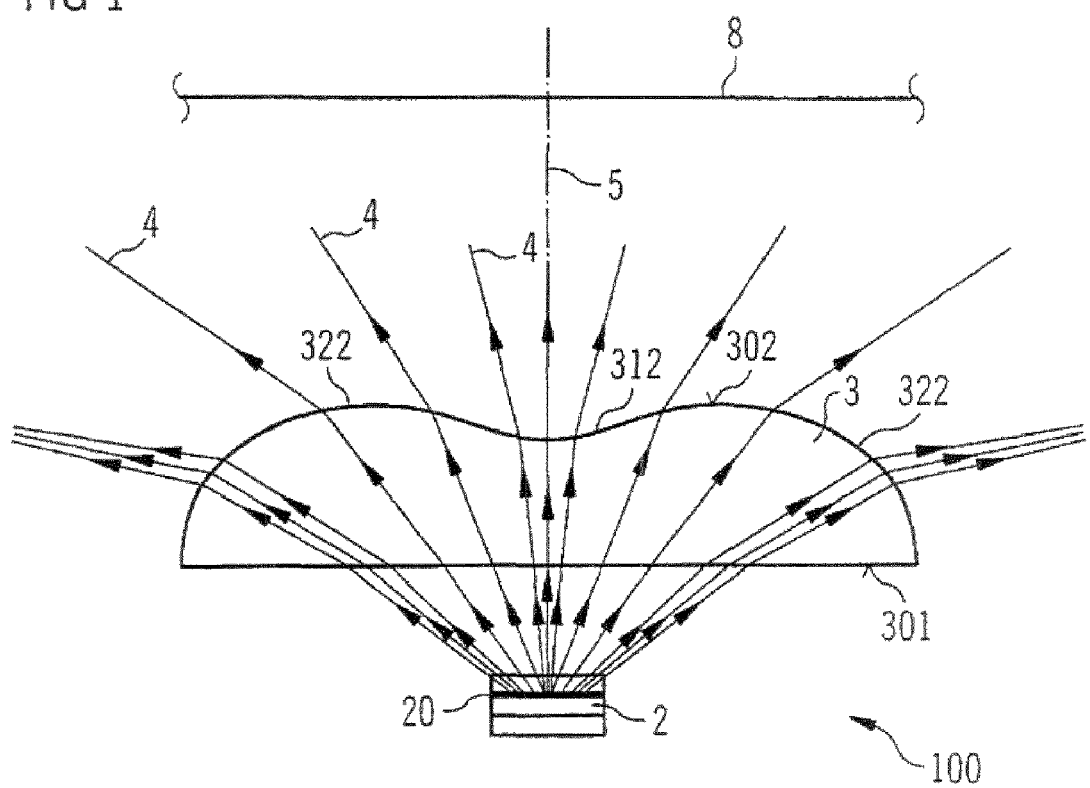

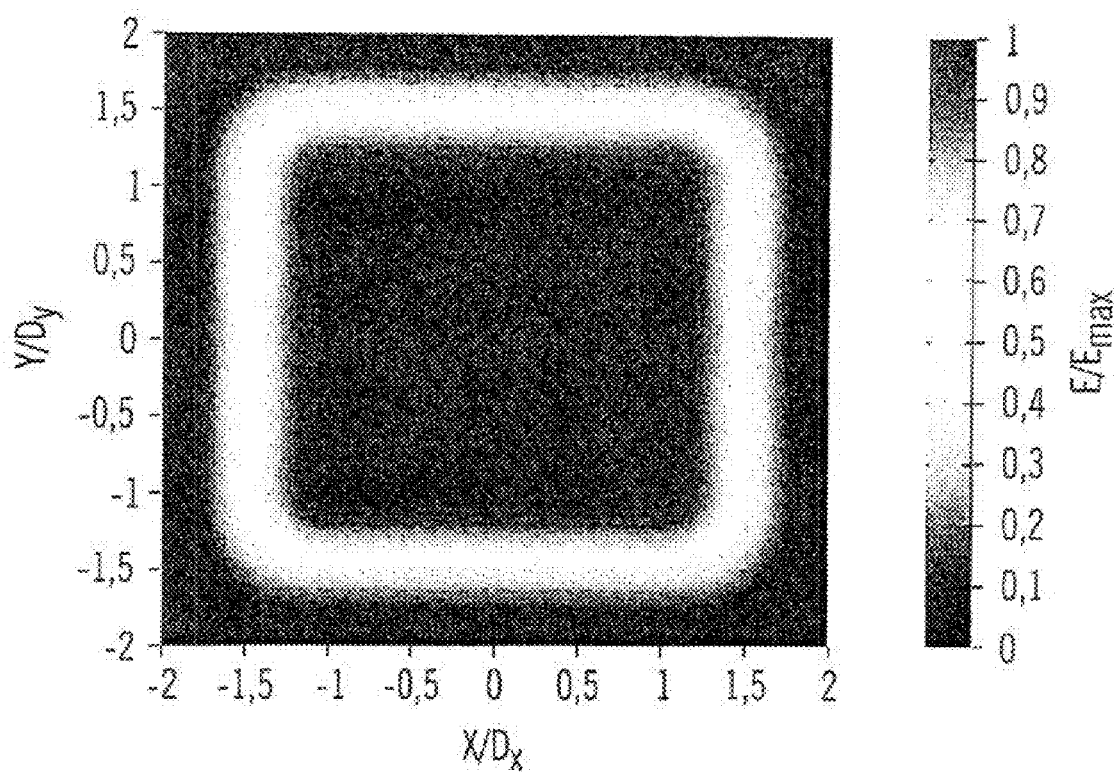

OPTOELECTRONIC COMPONENT AND ILLUMINATION DEVICE

CROSS-REFERENCE TO RELATED APPLICATIONS

This patent application is the National Stage of International Application No. PCT/DE2007/001149 filed on Jun. 28, 2007, which claims the priorities of German patent applications 102006030253.2, filed on Jun. 30, 2006 and 102006050880.7, filed on Oct. 27, 2006, the disclosure contents of which are hereby incorporated by reference.

TECHNICAL FIELD

The invention relates to an optoelectronic component and to an illumination device.

BACKGROUND

Optoelectronic components are frequently used to illuminate rectangular areas. For example, back-lighting apparatuses are known for flat screens, which have a plurality of optoelectronic components. However, the latter normally have a rotationally symmetrical emission characteristic. Homogeneous illumination of a rectangular area is not possible using optoelectronic components such as these since rotationally symmetrical beam cones cannot be superimposed, simply for basic mathematical reasons, in such a way that the area is illuminated homogeneously.

By way of example, if the components are arranged in a hexagonal grid in order to achieve an illumination intensity distribution which is as homogeneous as possible in a central area of the illuminated area, inhomogeneities occur at the edge of the illuminated area. The homogeneity of the illumination at the edge of the illuminated area can be improved by arranging the components in a rectangular grid. The homogeneity of the illumination in the central part of the area is then worse compared to the arrangement in the hexagonal grid, and the illumination intensity distribution has fluctuations which run on the same grid as the arrangement of the optoelectronic components.

In order to reduce these inhomogeneities, the components must be arranged at a very short distance from one another. The back-lighting apparatus therefore contains considerably more optoelectronic components than are required to achieve the desired light intensity.

Alternatively, the radiation can be output from a back-lighting apparatus through a diffuser plate with high reflectivity and low transmission. This forces multiple scattering to occur within the back-lighting apparatus, and increases the homogeneity of the output light, at the expense of efficiency. Additional optoelectronic components are then required in order to achieve the desired light intensity of the back-lighting apparatus.

In another procedure for reducing the inhomogeneities, the beam cones of the components are greatly widened by means of divergent lenses. The homogeneity which can be achieved in this way is, however, inadequate for many applications. Furthermore, this procedure places extremely stringent demands on the manufacturing tolerances and assembly tolerances.

SUMMARY

The disclosure describes an optoelectronic component which is suitable for homogeneous back-lighting of a surface, and an illumination apparatus which emits electromagnetic radiation with improved homogeneity, and which is particularly efficient.

An optoelectronic component has an optically active region. The optically active region comprises at least one semiconductor chip and a beam-forming element which has an optical axis. The optically active region has quadrant symmetry with respect to a coordinate system which is perpendicular to the optical axis. The semiconductor chip is provided for generating electromagnetic radiation. At least a part of this electromagnetic radiation, which is emitted by the semiconductor chip during operation, passes through the beam-forming element.

Thus, in other words, there is a coordinate system with two, in particular mutually perpendicular, coordinate axes, which are both at right angles to the optical axis and whose intersection lies on the optical axis. The optically active region has mirror-image symmetry with respect to the planes which are defined by the optical axis and in each case one of the axes of the coordinate system which is perpendicular thereto. In other words, the optically active region merges into itself when reflected on the plane which is defined by the optical axis and the first axis of the coordinate system which is perpendicular thereto, and on reflection along the plane which is defined by the optical axis and the second axis of the coordinate system which is perpendicular thereto.

In the specific case in which the optically active region also has mirror-image symmetry with respect to the angle bisectors of the first and second coordinate axes, which are arranged at right angles to one another, the optically active region in at least one embodiment also has 4-fold radial symmetry with respect to rotation about the optical axis. It therefore merges into itself in this case when rotated through 90° about the optical axis. However, the optically active region is advantageously not rotationally symmetrical. It therefore does not merge into itself on rotation through an arbitrary angle about the optical axis but, for example, only on rotation through an angle of 180° or a multiple thereof, or through an angle of 90° or a multiple thereof.

The distribution of the electromagnetic radiation which is emitted from the optoelectronic component is therefore likewise advantageously not rotationally symmetrical. In fact, the optoelectronic component advantageously emits electromagnetic radiation with a quadrant symmetrical light intensity distribution.

The beam-forming element preferably follows the semiconductor chip in the direction of the optical axis. The radiation is output from the optoelectronic component in one expedient embodiment at least essentially in the hemisphere above the beam-forming element which is remote from the semiconductor chip. Beams which are output from the optoelectronic component therefore preferably include an angle of $\leq 90°$ with the optical axis. The angle is preferably less than 90°.

In other words, the radiation which is output from an optoelectronic component is emitted into a "beam cone" whose axis of symmetry is preferably the optical axis of the beam-forming element of the component. In the present case, the beam cone does not have a rotationally symmetrical cross section, but a quadrant-symmetrical cross section.

In one embodiment of the optoelectronic component, the beam-forming element has the quadrant symmetry. However, in this case, the entire beam-forming element does not need to have quadrant symmetry. In fact, an area of the beam-forming element through which, in particular, no radiation passes, for example an edge area of the beam-forming element, may have a rotationally symmetrical shape, or any other desired shape.

However, it is important that the illuminated area of the beam-forming element through which at least a part of the electromagnetic radiation which is emitted from the at least one semiconductor chip during operation passes and through which the radiation is preferably output from the optoelectronic component, or at least a part of this illuminated area, has quadrant symmetry.

By way of example, the beam-forming element, the illuminated area or the part of the illuminated area is in the form of a rectangle, whose corners are rounded, in a plan view of the beam-forming element along the optical axis.

The optical axis expediently runs through the center point of the rectangle, and the axes of the coordinate system which is perpendicular to the optical axis point in the direction of the side centers. The rounding of the corners in one embodiment extends as far as the side centers, such that, in this embodiment, the sides are curved over their entire length. However, the side centers in this embodiment preferably have tangents which are perpendicular to the coordinate axes. The tangents to the side centers of opposite sides are particularly preferably parallel. The shape of the quadrant-symmetrical area of the beam-forming element can in this case also be referred to as a cushion shape, or as a "flattened circle".

In one embodiment, the beam-forming element comprises a lens, or the beam-forming element is a lens. The lens has, for example, a radiation inlet surface and/or a radiation outlet surface, which is a free-form surface. The radiation inlet surface is in this case that main surface of the lens which faces the semiconductor chip, and the radiation outlet surface is that main surface of the lens which faces away from the semiconductor chip.

In one embodiment, the radiation outlet surface is a smooth surface. The radiation inlet surface is preferably also a smooth surface, in particular a flat surface. In particular, a radiation outlet surface and/or a radiation inlet surface which is a smooth surface does not have any steps and/or kinks.

By way of example, the radiation inlet surface and/or the radiation outlet surface is a differentiable surface. The surface can preferably be represented by a polynomial which is a function of x and y. x and y in this case correspond to the coordinates along the first and the second axis of the coordinate system perpendicular to the optical axis. The values of the polynomial indicate the distance of this surface from the plane defined by the coordinate system in the direction of the optical axis, as a function of the position on the plane. The polynomial contains only even-order terms in x and y, thus advantageously resulting in a quadrant-symmetrical surface.

In a variant of this embodiment, the radiation outlet surface and/or the radiation inlet surface have/has a plurality of areas which are each described by a polynomial in x and y, but with different coefficients. The transitions between the areas are preferably continuous, and particularly preferably the first derivatives is also continuous, that is to say the areas each have the same gradients at the transitions, which means that the surface is not kinked at the transitions.

According to one embodiment, the radiation outlet surface has a central area, through which the optical axis passes and which has concave curvature, is planar or has slightly convex curvature.

By way of example, the central area is in the form of a rectangle, whose corners are rounded, in a plan view of the radiation outlet surface. As has already been described above, this also comprises a shape in which the sides are curved over their entire length. In one embodiment, the rounded rectangle has subareas which comprise the center points of the sides and have concave curvature. In other words, in this embodiment, the rounded rectangle is waisted.

The radiation outlet surface preferably also comprises an edge area which at least partially, but in particular completely, surrounds the central area at a distance from the optical axis, and has convex curvature.

In one embodiment, the edge area has sharper curvature than the central area, for example with the curvature of the edge area being twice as sharp as that of the central area. In a further embodiment, the curvature of the edge area increases with the distance from the optical axis. For example, the edge area comprises a first part which is adjacent to the optical axis and has a first convex curvature, and a second part, which is further away from the optical axis than the first part and has a second convex curvature, with the second convex curvature being greater than the first convex curvature.

In addition, the edge area, in particular the first part and/or the second part of the edge area, is in one embodiment in the form of a rectangle, whose corners are rounded, in a plan view of the radiation outlet surface.

Shaping of the radiation outlet surface and/or of the radiation inlet surface of the beam-forming element with a concave, flat or slightly convex central area and an outer area with convex curvature advantageously increases the intensity of the electromagnetic radiation which is output from the optoelectronic component at an angle to the optical axis, in comparison to the intensity of the radiation which is output essentially along the optical axis. The area which is illuminated by the optoelectronic component is thus advantageously enlarged.

Furthermore, the fact that the radiation outlet surface and/or the radiation inlet surface has a shape which is not rotationally symmetrical advantageously results in a surface area on a surface which runs at a distance from the optoelectronic component and preferably perpendicular to the optical axis being illuminated with a quadrant-symmetrical illumination intensity distribution.

In one embodiment of the optoelectronic component, the optical axis passes through the semiconductor chip. The main extent plane of the semiconductor chip is preferably perpendicular to the optical axis.

In a further embodiment, in addition to or as an alternative to the beam-forming element, the semiconductor chip has quadrant symmetry. By way of example, the semiconductor chip has a rectangular or square base area, and the optical axis passes through the center point of the base area. The base area of the semiconductor chip is generally parallel to its main extent plane.

In another embodiment, the optoelectronic component comprises a plurality of semiconductor chips which are arranged with quadrant symmetry. In other words, the positions at which the semiconductor chips are arranged together have quadrant symmetry. The semiconductor chips are preferably mounted on a mounting surface through which the optical axis passes, and which is preferably perpendicular to the optical axis. In this case, the mounting positions of the semiconductor chips on the mounting surface preferably have quadrant symmetry, overall.

In one embodiment, the semiconductor chip is arranged in a housing body. The housing body preferably comprises a reflector. In one embodiment, alternatively or in addition to the semiconductor chip or the semiconductor chips and/or the beam-forming element, the reflector has quadrant symmetry. As a reflector, the housing body comprises, for example, a depression with reflective walls in which the semiconductor chip is arranged.

The beam-forming element is preferably manufactured separately from the housing body and is attached to the housing body by, for example, at least one positioning element and/or at least one holding means. The positioning element and/or the holding means are/is arranged, for example, in the edge area of the beam-forming element. In at least one embodiment, it does not have quadrant symmetry. A beam-forming element which is manufactured separately from the housing body advantageously allows the optoelectronic component to be manufactured easily and cost-effectively. At the same time, the manufacturing tolerances are kept low and a particularly accurate positioning of the semiconductor chip and of the beam-forming element are achieved.

In one embodiment, the optoelectronic component comprises at least one semiconductor chip with an emission maximum in the red spectral range, at least one semiconductor chip with an emission maximum in the green spectral range, and/or at least one semiconductor chip with an emission maximum in the blue spectral range.

In a further embodiment, the optoelectronic component comprises a first semiconductor chip which emits electromagnetic radiation with a first spectral distribution during operation, and a second semiconductor chip which emits electromagnetic radiation with a second spectral distribution during operation. The optoelectronic component preferably also comprises a third semiconductor chip which emits electromagnetic radiation with a third spectral distribution during operation. The first, second and third spectral distributions respectively have, for example, a maximum in the red, green and blue spectral ranges.

In one embodiment, the optoelectronic component emits light with a white color impression during operation. For this purpose it comprises, for example, at least one semiconductor chip which emits in the red spectral range, one semiconductor chip which emits in the green spectral range, and one semiconductor chip which emits in the blue spectral range.

If the optoelectronic component comprises a plurality of semiconductor chips which emit electromagnetic radiation with the same spectral distribution during operation, then these are particularly preferably arranged with quadrant symmetry. In other words, the positions at which the semiconductor chips are arranged have quadrant symmetry overall.

An illumination device comprises at least one optoelectronic component having an optically active region which has quadrant symmetry, for example according to at least one of the exemplary embodiments described above.

In one embodiment, the illumination device comprises side surfaces, for example inner surfaces of side walls which, particularly preferably, are designed to be reflective, in particular mirrored. Mirrored side surfaces are designed to be reflective and reflect back radiation which is incident on them at least essentially directionally.

The side surfaces preferably run parallel to the optical axis of the beam-forming element. The side surfaces surround the optoelectronic component, preferably at least in places, on a plane which is defined by the axes of the coordinate system which is perpendicular to the optical axis. Particularly preferably, they completely surround the component.

In one embodiment, two respectively opposite side surfaces are arranged parallel to one another and preferably at right angles to the two other side surfaces. Overall, in one expedient embodiment, the side walls form a rectangle or square in a plan view along the optical axis.

In one embodiment, in a plan view along the optical axis, the side surfaces form a rectangle with an aspect ratio which corresponds to the aspect ratio of the rounded rectangle which describes the beam-forming element and/or its illuminated area, the central area of the lens and/or the outer area of the lens.

The distance from the side surfaces to the optical axis in one embodiment is chosen such that the portion of the electromagnetic radiation which is output from the optoelectronic component and strikes a luminous area of the illumination device directly, and the portion of the electromagnetic radiation which is output from the component and is directed to the luminous area by the side surfaces together result in a homogeneous illumination intensity distribution on the luminous area.

The luminous area of the illumination device is in this case a main surface of the illumination device which follows a radiation outlet surface of the optoelectronic component in the direction of the optical axis. The luminous area is preferably perpendicular to the optical axis. At least a part of the electromagnetic radiation which is emitted from the optoelectronic component is output through the luminous area.

In the case of a homogenous illumination intensity distribution, the illumination intensity is essentially independent of the position on the luminous area.

In a further embodiment, the illumination device comprises a plurality of optoelectronic components whose optical axes are preferably arranged essentially parallel to one another.

The number of optoelectronic components is advantageously less than in the case of conventional illumination devices, but nevertheless the electromagnetic radiation which is output from the illumination device is particularly homogeneous. Illumination devices are therefore advantageously achieved without loss of light intensity and homogeneity of the emitted radiation which, with the same physical height, that is to say the same distance between the semiconductor chips and the luminous area, require fewer semiconductor chips or in which the physical height is reduced for the same number of semiconductor chips. In one advantageous embodiment, the physical height is less than or equal to 30 mm, for example with the illumination device having a physical height of between 10 mm and 30 mm, with the limits being inclusive.

By way of example, the optoelectronic components are arranged on a mounting surface, in particular on a flat mounting surface. The optical axis of an optoelectronic component is then expediently perpendicular to the mounting surface, and the plane which is defined by the coordinate system perpendicular to the optical axis is parallel to the mounting surface.

The beam cones of adjacent optoelectronic components preferably intersect on a plane perpendicular to the optical axes, for example on the luminous area of the illumination device.

In one expedient embodiment, the optoelectronic components are arranged at the grid points of a grid. In other words, the components are located at the intersection points of the grid lines of an imaginary grid which, for example, runs on the mounting surface.

The grid preferably has basic units which are in the form of parallelograms, are rectangular or are square. However, the grid lines may also have a curved profile. A first family of grid lines preferably runs parallel to the first axis of the coordinate system which is perpendicular to the optical axis, and a second family of grid lines runs parallel to the second axis of the coordinate system which is perpendicular to the optical axis of an optoelectronic component. Particularly preferably, the axes of the corresponding coordinate systems of a plurality of optoelectronic components, in particular of all the optoelectronic components, are aligned in this manner. In this way, a particularly homogeneous illumination intensity on the luminous area is advantageously achieved.

In one embodiment, the beam cone of an optoelectronic component has superimposed on it the beam cones of the optoelectronic components which are arranged at directly adjacent grid locations. In another embodiment, the beam cone of the component additionally has superimposed on it at least the next-but-one neighbors arranged along one direction. The beam cones of in each case at least five optoelectronic components are then superimposed along this direction, while three beam cones are in each case superimposed along a direction in which only the beam cones of directly adjacent components are superimposed. No superimposition, or only a small amount of superimposition, preferably takes place with the beam cones of components which are arranged further way.

In this case, the illumination intensity of the individual components along the first axis and along the second axis of the coordinate system which is perpendicular to the optical axis are superimposed to form the overall illumination intensity in this direction, with this overall illumination intensity preferably being constant. Because of the quadrant-symmetrical form of the radiation outlet surfaces, this also results in a constant illumination intensity in the other directions of the luminous area.

In other words the overall illumination intensity as a function of the coordinates x and y is essentially constant ($E(x,y) = E_0$), with the x-direction running along the first axis, and the y-direction running along the second axis. The overall illumination intensity is created by superimposition of the illumination intensities $e_{i,j}(x,y)$ of the individual components with the indices i and j. These have the same, or at least virtually the same, emission characteristics. There is therefore a function $e(x,y)$ by means of which the illumination intensity $e_{i,j}(x,y)$ of a single component, in particular any given component, which is located at the point $(x_i, y_i)$ can be represented, such that $e_{i,j}(x,y) = e(x-x_i, y-y_i)$. An emission characteristic with quadrant symmetry is created, for example, if the form of the x-dependency of e is independent of y and the form of y-dependency of e is independent of x. This then results in functions $e_x$ and $e_y$ as well as a constant $e_0$, such that $e(x,y) = e_x(x) \cdot e_y(y) \cdot e_0$. Furthermore, the functions $e_x$ and $e_y$ are expediently chosen such that $\Sigma_i e_x(x-x_i) \equiv e_x$ and $\Sigma_j e_y(y-y_j) \equiv e_y$, where $e_x$ and $e_y$ are two constants. For example, if the components are arranged at the same intervals Dx in the x-direction, then $e_x(x) = 1 + \cos(x/Dx \cdot \pi)$ for $x \in [-Dx; Dx]$, or else $e_x(x) = 0$, is one example of a function such as this. The illumination intensities of the individual components are then superimposed overall to form a constant value:

$E(x,y) = \Sigma_{i,j} e_{i,j}(x,y) = \Sigma_{i,j} e(x-x_i, y-y_i) =$ $e_0 \Sigma_{i,j} e_x(x-x_i) \cdot e_y(y-y_i) = e_0 \Sigma_i [e_x(x-x_i) \cdot \Sigma_j e_y(y-y_i)] =$ $e_0 \cdot e_y \Sigma_i e_x(x-x_i) = e_0 \cdot e_y \cdot e_x = \text{const.}$ If the illumination intensities of more than the respective direct neighbors in one direction are superimposed, the illumination device is advantageously only slightly sensitive to the tolerances which can occur, for example, during the manufacture and assembly of the components. Despite such tolerances, the luminous area of the illumination device advantageously has a homogeneous illumination intensity distribution.

For example, a component in which the radiation outlet surface of the beam-forming element is manufactured as a polynomial in x and y with exclusively even exponents and with coefficients which are preferably matched to the emission characteristics of the semiconductor chip and/or the geometry of the illumination device, results in a quadrant-symmetrical illumination intensity distribution which is particularly suitable for achieving a virtually constant illumination intensity distribution on the illumination device.

In a further embodiment of the illumination device, the optoelectronic components are surrounded by side surfaces, for example the inner surfaces of side walls, which in particular are designed to be reflective. The side surfaces preferably completely surround the components on the plane of the mounting surface. While diffusely reflective side surfaces are frequently used for illumination devices of a conventional type, the side surfaces in the present case are preferably mirrored, as a result of which they directionally reflect radiation which is incident on them. The side surfaces expediently run parallel to the optical axis of a component. One side surface preferably runs parallel to a family of grid lines of the grid at whose grid points the components are arranged.

The periodicity of the grid is thus advantageously continued by the mirrored side surface.

The reflective side surfaces advantageously result in the illumination intensity being particularly highly homogeneous, even at the edge of the luminous area of the illumination device.

In the present case, one side surface, in particular each side surface, in one embodiment is at a distance corresponding to half a side length of a basic unit of the grid from the grid line which is adjacent to it and which is parallel to it.

Overall, in one expedient embodiment, the side walls form a rectangle or a square in a plan view along the optical axis. In one embodiment, the side walls form a rectangle with an aspect ratio which corresponds to the aspect ratio of the rounded rectangle which describes the beam-forming element or the illuminated area of the beam-forming element, the central area of the lens and/or the outer area of the lens of a component.

In one embodiment, the illumination device comprises a first optoelectronic component which emits electromagnetic radiation with a first spectral distribution during operation, and a second optoelectronic component which emits electromagnetic radiation with a second spectral distribution during operation. The illumination device preferably also comprises a third optoelectronic component which emits electromagnetic radiation with a third spectral distribution during operation.

By way of example, the illumination device comprises an optoelectronic component which has an emission maximum in the red spectral range, an optoelectronic component which has an emission maximum in the green spectral range, and/or an optoelectronic component which has an emission maximum in the blue spectral range.

By way of example, the illumination device comprises a plurality of red, green and blue emitting optoelectronic components, respectively, so that light with a white color impression is emitted during operation. Alternatively, the illumination device may also contain a plurality of optoelectronic components which emit light with a white color impression during operation.

The optoelectronic components, in particular the components which emit electromagnetic radiation with the same spectral distribution, are advantageously arranged such that the electromagnetic radiation which is emitted from them has an illumination intensity distribution which is essentially homogeneous on a plane perpendicular to the optical axes, for example on the luminous area. The illumination intensity is therefore independent of the position within the plane. It is therefore advantageously possible to arrange the optoelectronic components which emit electromagnetic radiation with a different spectral distribution during operation in any desired manner with respect to one another. Nevertheless, the different colors are mixed homogeneously over the entire luminous area. For example, those optoelectronic components which emit electromagnetic radiation with a different spectral distribution during operation are offset with respect to one another on the mounting surface. In one embodiment, the optoelectronic components which emit red, green and blue are arranged on mutually offset grids.

In one embodiment of the illumination device, at least a part of the radiation which is emitted from the optoelectronic components is output through a diffuser surface. The diffuser surface may be the luminous area, or the diffuser surface is adjacent to the luminous area. The diffuser surface may be in the form of a diffuser plate or diffuser film. The diffuser surface is expediently homogeneously back-lit by the optoelectronic components.

In one embodiment, the illumination device is a backlighting apparatus, for example for a liquid crystal display (or LCD for short).

Further advantages and advantageous embodiments will become evident from the exemplary embodiments which are described in the following text in conjunction with the FIGS. 1 to 13.

BRIEF DESCRIPTION OF THE DRAWINGS

FIG. 1 shows a schematic cross section through an optoelectronic component according to a first exemplary embodiment.

FIG. 12C shows the relative illumination intensity distribution of nine adjacent optoelectronic components of the illumination device according to the exemplary embodiment shown in FIG. 10.

DETAILED DESCRIPTION

Figure 2A:
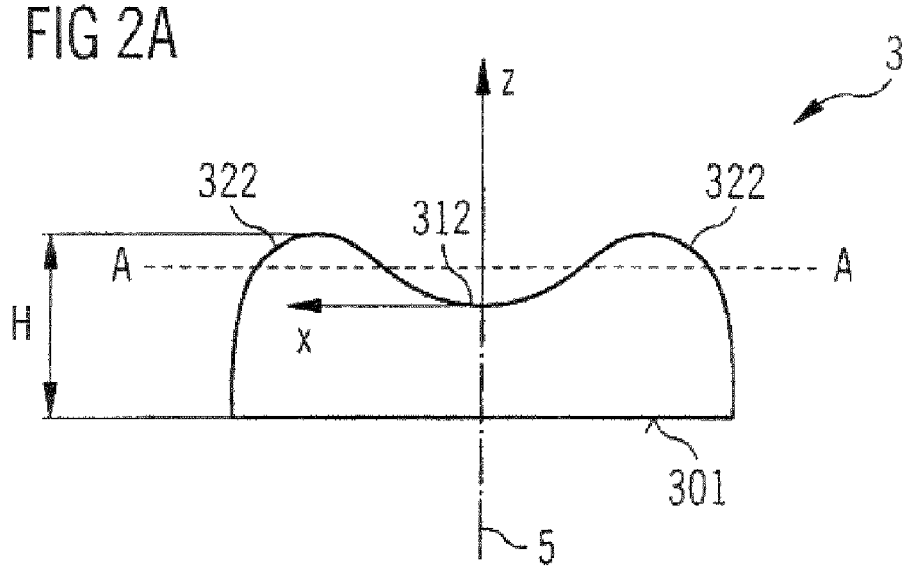
FIGS. 2A to 2C show schematic cross sections through various examples of beam-forming elements.

Identical elements and elements having the same effect are each provided with the same reference symbols in the exemplary embodiments and figures. The illustrated elements and their size relationships with respect to one another should in principle not be regarded as being true to scale. In fact, individual elements may be illustrated in an exaggeratedly thick and/or curved and/or distorted form in order to improve the capability to illustrate them and/or in order to assist understanding.

The optoelectronic component 1 according to the first exemplary embodiment, which is illustrated in FIG. 1 has an optically active region 100. The optically active region 100 comprises a semiconductor chip 2 and a beam-forming element 3 which, in the present case, is a lens.

The semiconductor chip 2 has a layer sequence which contains a semiconductor material. For example, the semiconductor material is a III-V compound semiconductor material, for example AlInGaN. The layer sequence comprises an active layer 20, which is intended to produce electromagnetic radiation, indicated by arrows 4.

A layer sequence which contains a III-V compound semiconductor material is, in the present context, an active, that is to say electroluminescent, epitaxial layer sequence, in which at least one layer, preferably the active layer 20, is composed of a III/V compound semiconductor material, for example a nitride-III-compound semiconductor material such as $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. In fact, it may have one or more dopants and additional components. However for the sake of simplicity, the above formula contains only the major components of the crystal lattice (Al, Ga, In, N) although these may be partially replaced by small amounts of further substances.

A part of the electromagnetic radiation 4 which is emitted from the semiconductor chip 2 is coupled into the beam-forming element 3 through a radiation inlet surface 301 and is coupled out from it again as completely as possible through a radiation outlet surface 302. The radiation inlet surface 301 is a main surface, which faces the semiconductor chip 2, of the beam-forming element 3, and the radiation outlet surface 302 is a main surface, which faces away from the semiconductor chip 2, of the beam-forming element 3.

The radiation inlet surface 301 is flat and perpendicular to an optical axis 5 of the beam-forming element 3. The radiation outlet surface 302 has a central area 312 with concave curvature, through which the optical axis 5 passes. The central area 312 with concave curvature is completely surrounded by an outer area 322 with convex curvature.

Figure 2B:
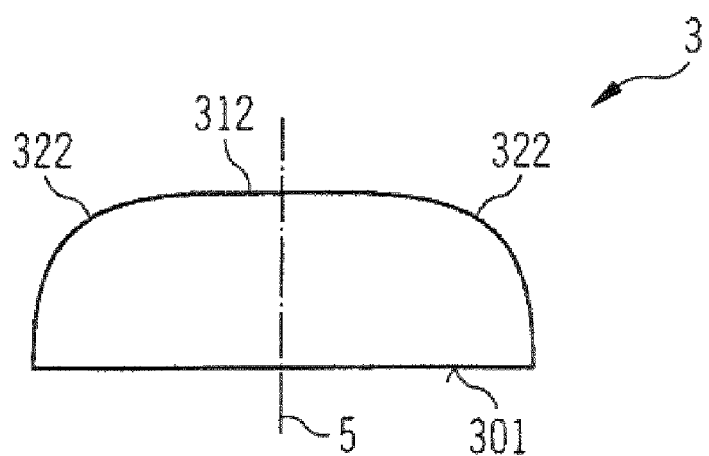
Figure 2C:
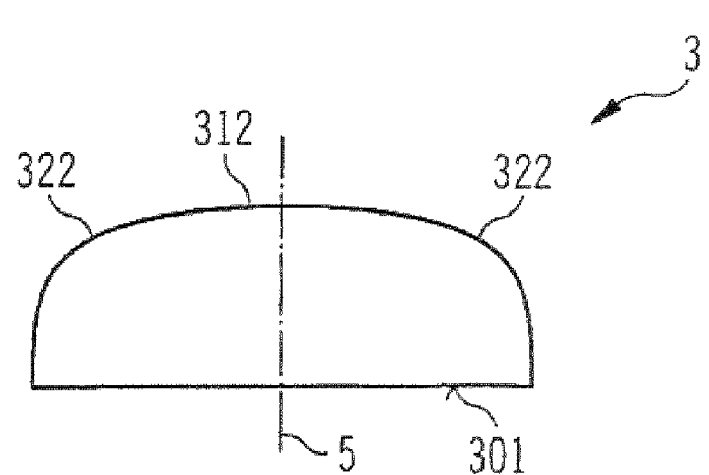

This also corresponds to the embodiment of the beam-forming element 3 shown in FIG. 2A. Alternatively, the central area may also be planar or have convex curvature, as is shown by way of example in FIGS. 2B and 2C, respectively. Particularly if the central area 312 has convex curvature, this curvature is preferably less than the curvature of the outer area 322.

In the region where the central area 312 merges into the outer area 322, both areas preferably have the same curvature, this resulting in a smooth transition.

Figure 3A:
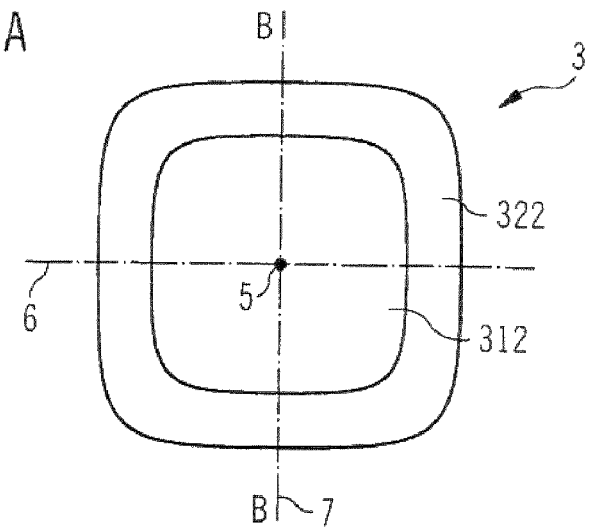
FIGS. 3A to 3C show schematic longitudinal sections of various examples of a beam-forming element.

In a plan view of the radiation outlet surface 302 along the optical axis 5, the beam-forming element 3 is in the form of a square with rounded corners, as is illustrated by the longitudinal section along the plane A-A (cf. FIG. 2A) in FIG. 3A. FIG. 3A also shows the plane B-B along which the cross sections shown in FIGS. 2A to 2C were made.

Figure 3B:
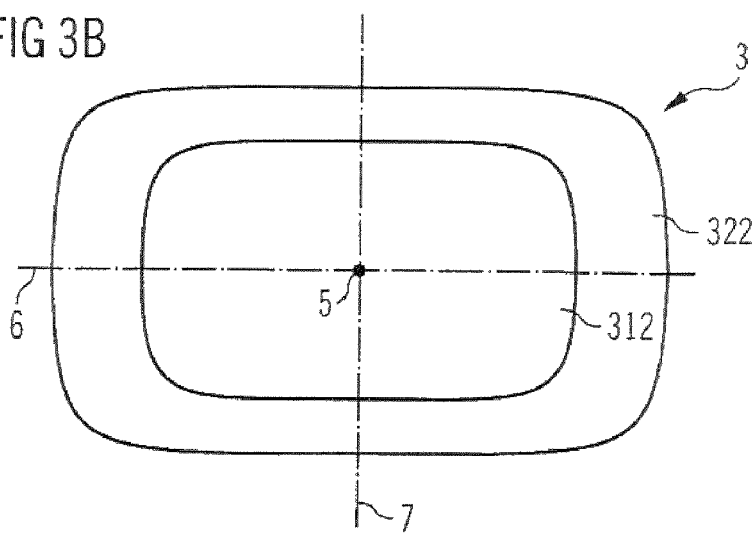

A schematic longitudinal section of an alternative embodiment of the beam-forming element 3 is illustrated in FIG. 3B. In this embodiment, both the central area 312 and the outer area 322 are in the form of a rectangle with rounded corners.

Figure 3C:
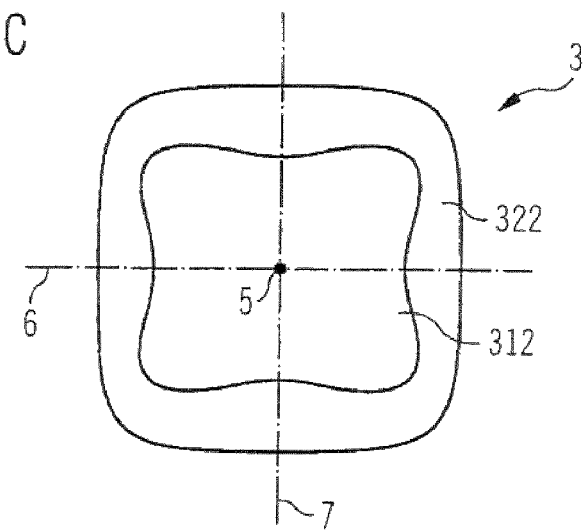

In the embodiment of the beam-forming element 3 shown in FIG. 3C, the central area 312 of the beam-forming element 3 is once again a square with rounded corners, but it is waisted in an area around the center points of the sides.

FIGS. 3A to 3C show the first axis 6 and the second axis 7 of a coordinate system which is perpendicular to the optical axis 5. The first axis 6 and the second axis 7 of the coordinate system are perpendicular to one another and intersect on the optical axis 5. The beam-forming element 3 has mirror-image symmetry with respect to a reflection on a plane through the first axis 6 of the coordinate system and the optical axis 5, and with respect to a reflection on a plane through the second axis 7 and the optical axis 5. This is referred to as quadrant symmetry.

The radiation outlet surface 302 of the beam-forming element 3 in the exemplary embodiment shown in FIGS. 2A and 3A is described by the polynomial, $z(x,y)=10(0.2(x/10)^2+0.2(y/10)^2-1.3(x/10)^4-1.3(y/10)^4-1.0(x/10)^2(y/10)^2)$, with the z-direction running parallel to the optical axis 5. The x-direction and the y-direction run parallel to the first and the second axis 6, 7, respectively. The origin of the coordinate system (x=0, y=0, z=0) coincides with the intersection of the radiation outlet surface 302 and the optical axis 5 (cf. FIG. 2A). The height H of the beam-forming element 3, that is to say the greatest distance between the radiation inlet surface 301 and a point on the radiation outlet surface 302, is, for example, 5 mm.

Figure 4A:
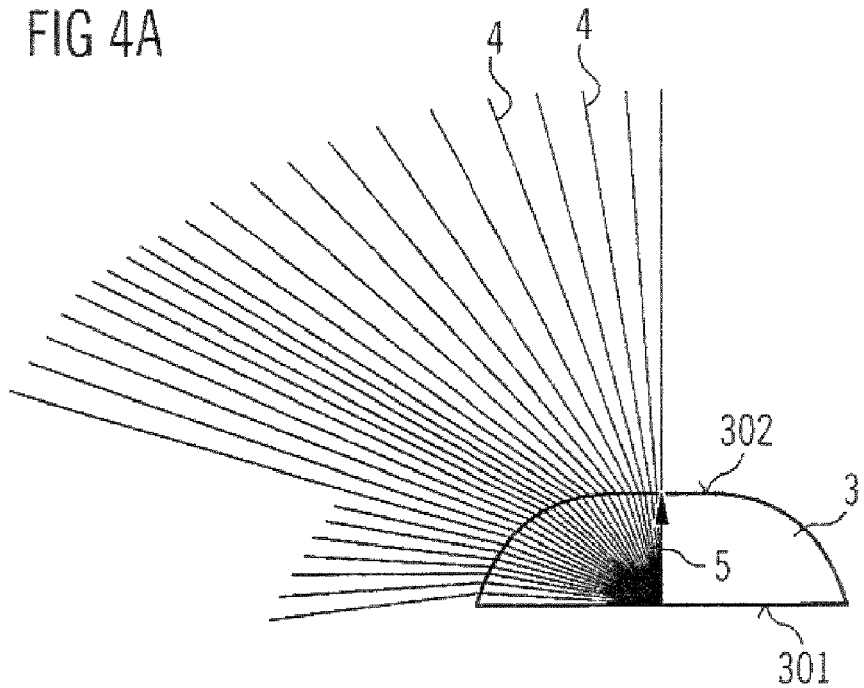
FIG. 4A shows a schematic side view of the beam-forming element shown in FIG. 3A, with examples of beam paths.
Figure 4B:
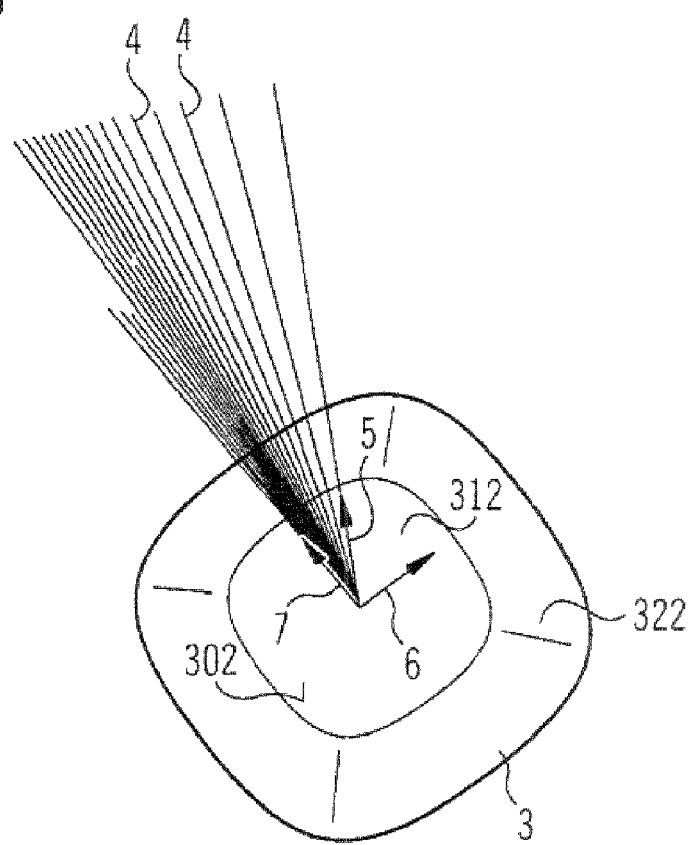
FIG. 4B shows a schematic, perspective view of the beam-forming element shown in FIG. 4A.

Due to the shape of the radiation outlet surface 302 of the beam-forming element 3, the part of the electromagnetic radiation 4 which is emitted from the semiconductor chip 2 during operation and is coupled into the beam-forming element 3 through the radiation inlet surface 301 is deflected away from the optical axis 5. This is illustrated in FIG. 1 as well as in the side view in FIG. 4A and the perspective view in FIG. 4B using the examples of beams 4 of the electromagnetic radiation. By way of example, this results in illumination of an area on a plane 8 which is arranged perpendicular to the optical axis downstream beam-forming element 3 at a distance from the radiation outlet surface 302, with this area advantageously being larger than an area which would be illuminated by the semiconductor chip 2 without the beam-forming element 3.

Figure 5:
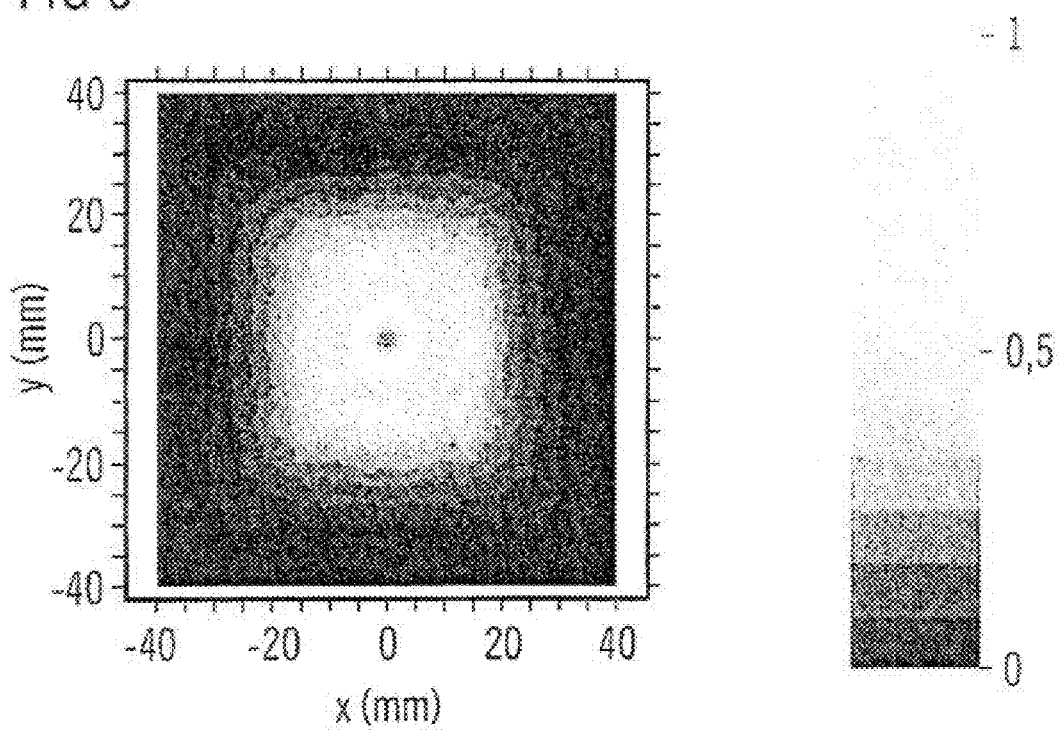
FIG. 5 shows the relative illumination intensity distribution of the optoelectronic component according to the first exemplary embodiment, in the form of a false-color illustration.

The illumination intensity distribution on the area 8 is illustrated in exemplary and schematic form in FIG. 5. The beam-forming element 3 results in the illumination intensity distribution also having quadrant symmetry with respect to the coordinate system which is defined by the first axis 6 (x-axis) and the second axis 7 (y-axis).

Figure 6:
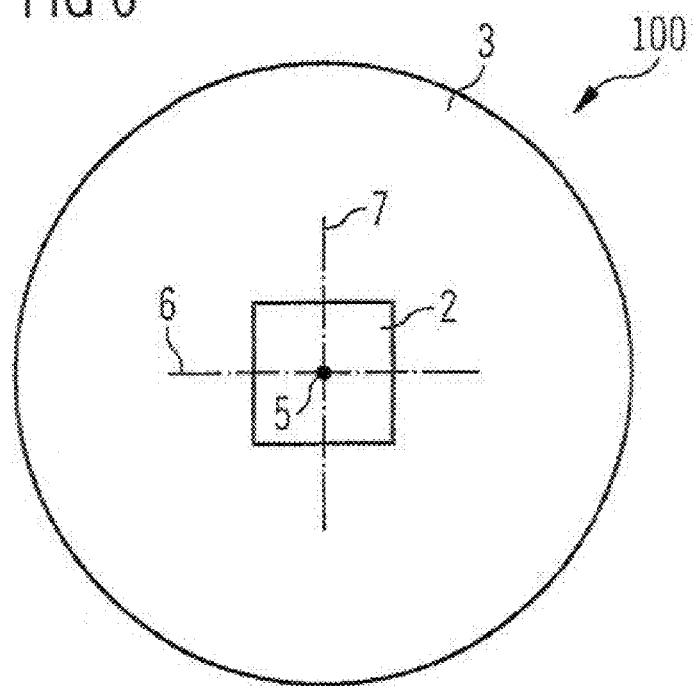
FIG. 6 shows an optoelectronic component according to a second exemplary embodiment.

In the second exemplary embodiment of an optoelectronic component 1, which is illustrated in FIG. 6, the beam-forming element 3 is designed to be rotationally symmetrical. In contrast, the semiconductor chip 2 has quadrant symmetry with respect to the coordinate system which is perpendicular to the optical axis 5 and is defined by the axes 6 and 7.

In one development of this exemplary embodiment, the optically active region comprises a plurality of semiconductor chips 2 which are arranged with quadrant symmetry. For example, in the third exemplary embodiment as shown in FIG. 7A, one semiconductor chip 2 is arranged in each quadrant I, II, III and IV.

However, it is also possible for both the semiconductor chip or chips 2 and the beam-forming element 3 to have quadrant symmetry.

Figure 7A:
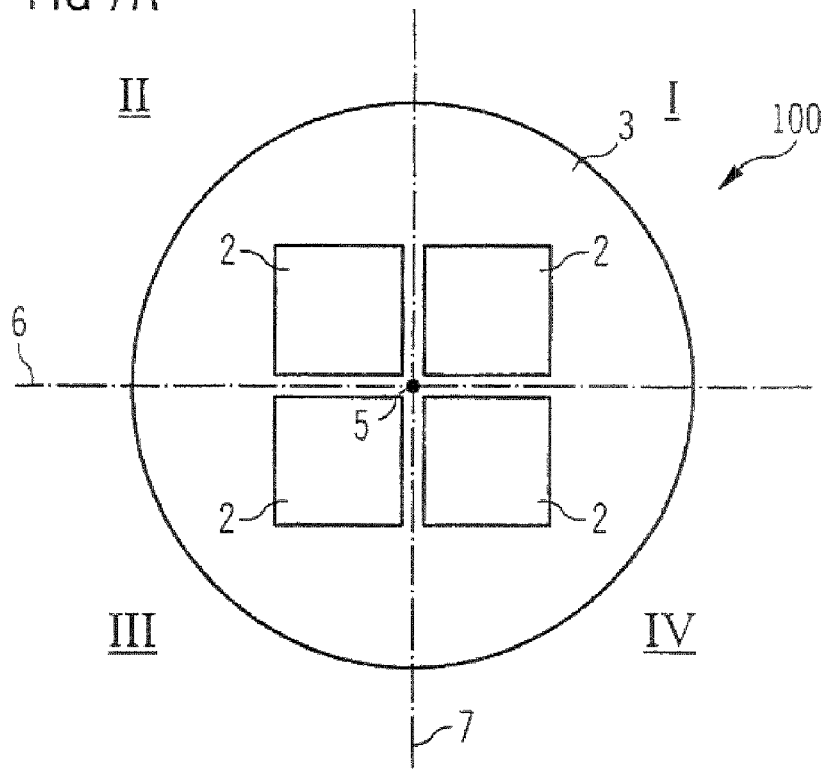
FIG. 7A shows an optoelectronic component according to a third exemplary embodiment.
Figure 7B:
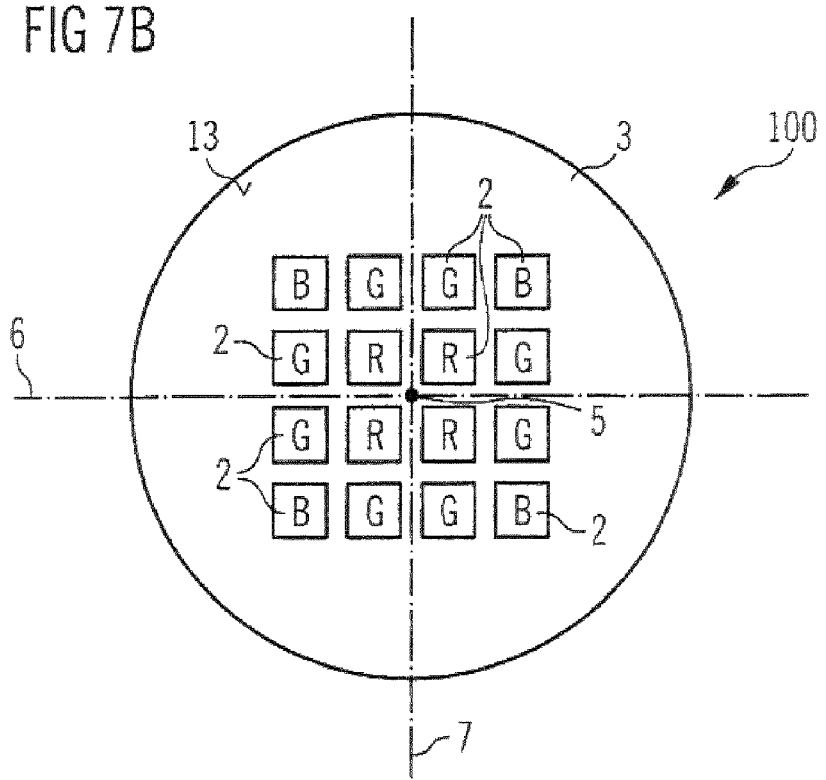
FIG. 7B shows a variant of the optoelectronic component according to the exemplary embodiment shown in FIG. 7A.

One variant of the optoelectronic component 1 as shown in the exemplary embodiment in FIG. 7A is shown in FIG. 7B, according to which the optoelectronic component 1 comprises a plurality of semiconductor chips 2 which have an emission maximum in the red spectral range, indicated by the letter "R" in the drawing. In addition, the component 1 comprises a plurality of semiconductor chips 2 which have an emission maximum in the blue spectral range, and a plurality of semiconductor chips 2 which have an emission maximum in the green spectral range, respectively indicated in the drawing by the letters "B" and "G". The semiconductor chips are arranged on a common mounting surface 13.

The plurality of semiconductor chips 2 which have an emission maximum in the red spectral range have quadrant symmetry with respect to the coordinate system which is perpendicular to the optical axis 5 and has the axes 6, 7. The axes 6, 7 of the coordinate system run parallel to the mounting surface 13.

The plurality of semiconductor chips 2 which have an emission maximum in the blue spectral range, and the plurality of semiconductor chips 2 which have an emission maximum in the green spectral range, also have the same quadrant symmetry.

Figure 8:
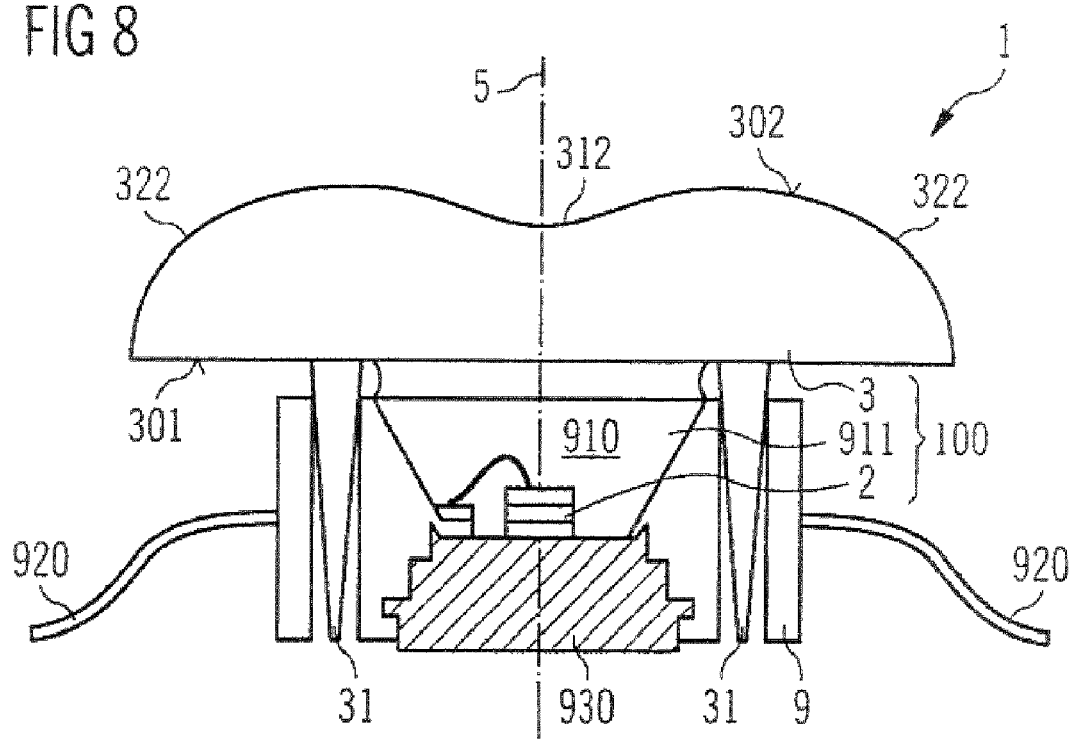
FIG. 8 shows an optoelectronic component according to a fourth exemplary embodiment.

In the fourth exemplary embodiment of the optoelectronic component 1, which is illustrated in FIG. 8, the semiconductor chip 2 is arranged in a housing body 9. The semiconductor chip 2 is located in a bottom area of a recess 910 in the housing body 9. The side walls 911 of the recess 910 are designed to be reflective.

The optically active region 1 in the present case comprises the semiconductor chip 2, the beam-forming element 3 which is attached to the housing body 9, and the reflective side walls 911.

In the present case, the housing body 9 comprises a thermal connecting part 930 which has a mounting surface on which the semiconductor chip 2 is mounted. At the same time, the mounting surface forms the bottom of the recess 910. Furthermore, the housing body 9 has two electrical connecting conductors 920, to which the semiconductor chip 2 is electrically conductively connected. By way of example, the thermal connecting part 930 consists of a metal and is electrically conductively connected to a bottom side, which faces the mounting surface, of the semiconductor chip 2 and to the first electrical connecting conductor. The top side, which is opposite the bottom side, of the semiconductor chip is, for example, connected by means of a bonding wire to a second electrical connecting conductor. The thermal connecting part 930 advantageously allows heat to be dissipated efficiently from the semiconductor chip. For example, this ensures that the semiconductor chip 2 and the beam-forming element 3 do not change their mutual arrangement, or change it only slightly, during operation, and that the optoelectronic component 1 has a beam profile which is constant over time during operation.

The beam-forming element 3 is attached to the housing body 9 by guide elements 31, which engage in the housing body 9, and by holding means (not shown).

Figure 9:
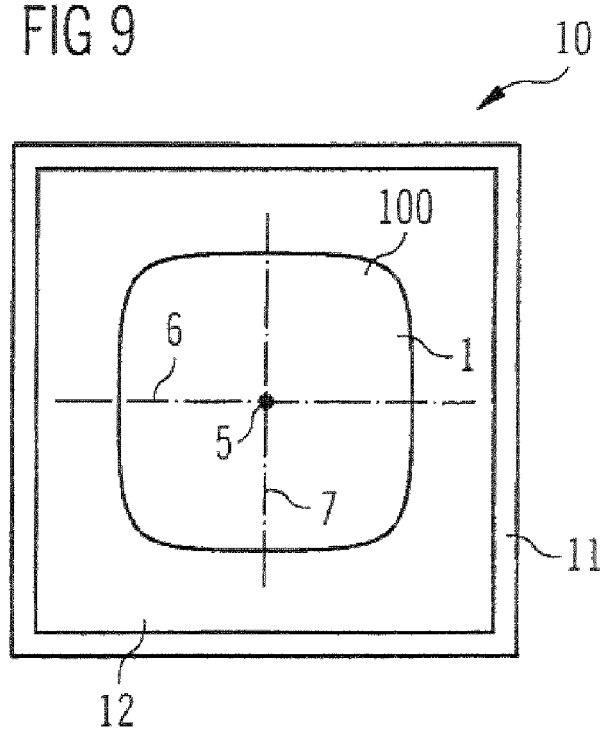
FIG. 9 shows an illumination device according to a first exemplary embodiment.

An illumination device according to the first exemplary embodiment shown in FIG. 9 comprises an optoelectronic component 1, whose optically active region 100 has quadrant symmetry with respect to a right-angle coordinate system, which is perpendicular to the optical axis 5 and has a first axis 6 and a second axis 7.

Furthermore, the illumination device 10 comprises side walls 11 which run parallel to the optical axis 5. The side walls 11 completely surround the optoelectronic component 1 on a plane which is defined by the axes 6, 7 of the coordinate system and which in the present case is also the main extent plane of the semiconductor chip 2.

Two respectively opposite side walls 11 are arranged parallel to one another and at right angles to the two other side walls 11. Overall, the side walls 11 form a square, in a plan view along the optical axis 5.

The side walls 11 are mirrored, at least on their side facing the optoelectronic component 1. This means that they are designed to be reflective and directionally reflect back radiation which is incident on them. The distance between the side walls 11 and the optical axis 5 is preferably chosen such that that component of the electromagnetic radiation 4 which is output from the light outlet surface 302 of the optoelectronic component 1 and directly strikes a luminous area 12 of the illumination device 10, and that component of the electromagnetic radiation 4 which is output from the light outlet surface 302 of the component 1, strikes the reflective side walls 11 and is directed therefrom to the luminous area 12, together result in a homogeneous light intensity distribution on the luminous area 12.

The luminous area 12 of the illumination device 10 is in this case a main surface of the illumination device 10 which follows the radiation outlet surface 302 of the optoelectronic component 1 in the direction of the optical axis 5. The luminous area 12 is preferably perpendicular to the optical axis 5. At least a part or the electromagnetic radiation 4 which is emitted from the optoelectronic component 1 is expediently output through the luminous area 12.

In the case of a homogeneous illumination intensity distribution, the illumination intensity is, in particular, independent of the position on the luminous area 12.

Figure 10:
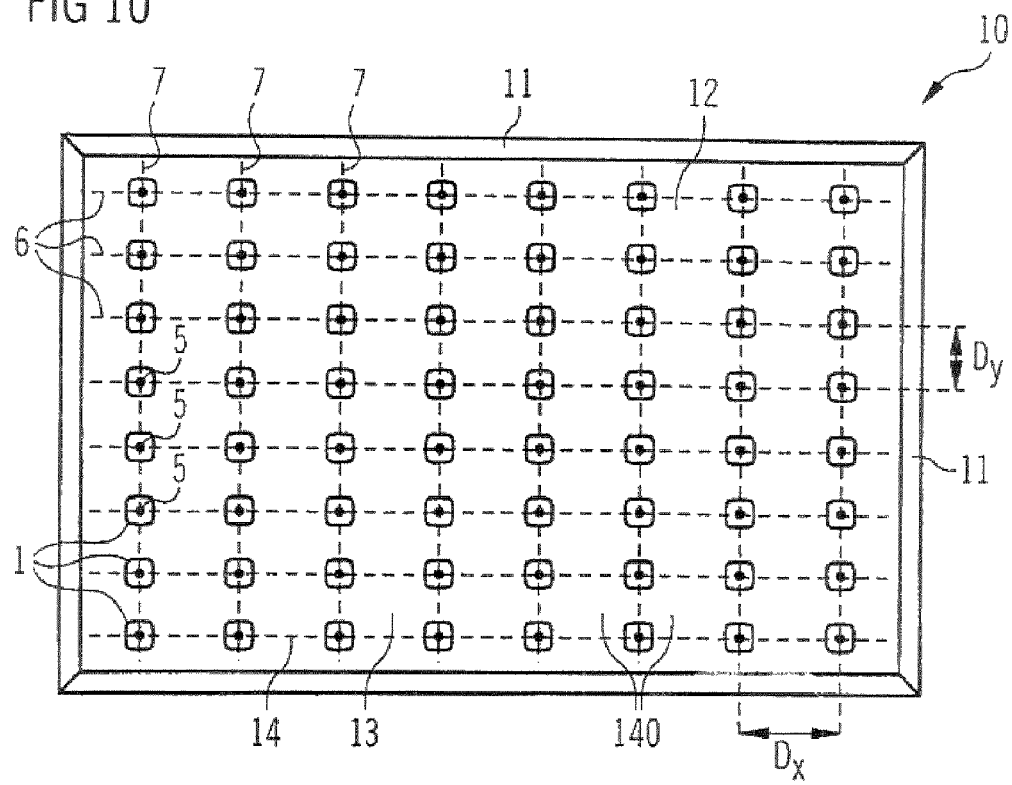
FIG. 10 shows an illumination device according to a second exemplary embodiment.

The illumination device 10 according to a second exemplary embodiment, which is illustrated in FIG. 10, comprises a plurality of optoelectronic components 1. The components 1 are arranged on a flat mounting surfaces 13. The optical axes 5 of the components 1 are perpendicular to the mounting surface 13.

The optoelectronic components 1 are arranged at the grid points of an (imaginary) grid 14 on the mounting surface 13, in particular with the optical axes 5 of the components 1 passing through the grid points. The grid lines in the present case coincide with the first axes 6 (x-direction) and the second axes 7 (y-direction) of the coordinate systems which are perpendicular to the optical axes 5, with respect to which the optically active regions 100 of the optoelectronic components 1 each have quadrant symmetry.

The distance between the optoelectronic components 1 is chosen such that the beam cones of two respectively adjacent optoelectronic components 1 are superimposed along the x-direction and along the y-direction.

Figure 13:
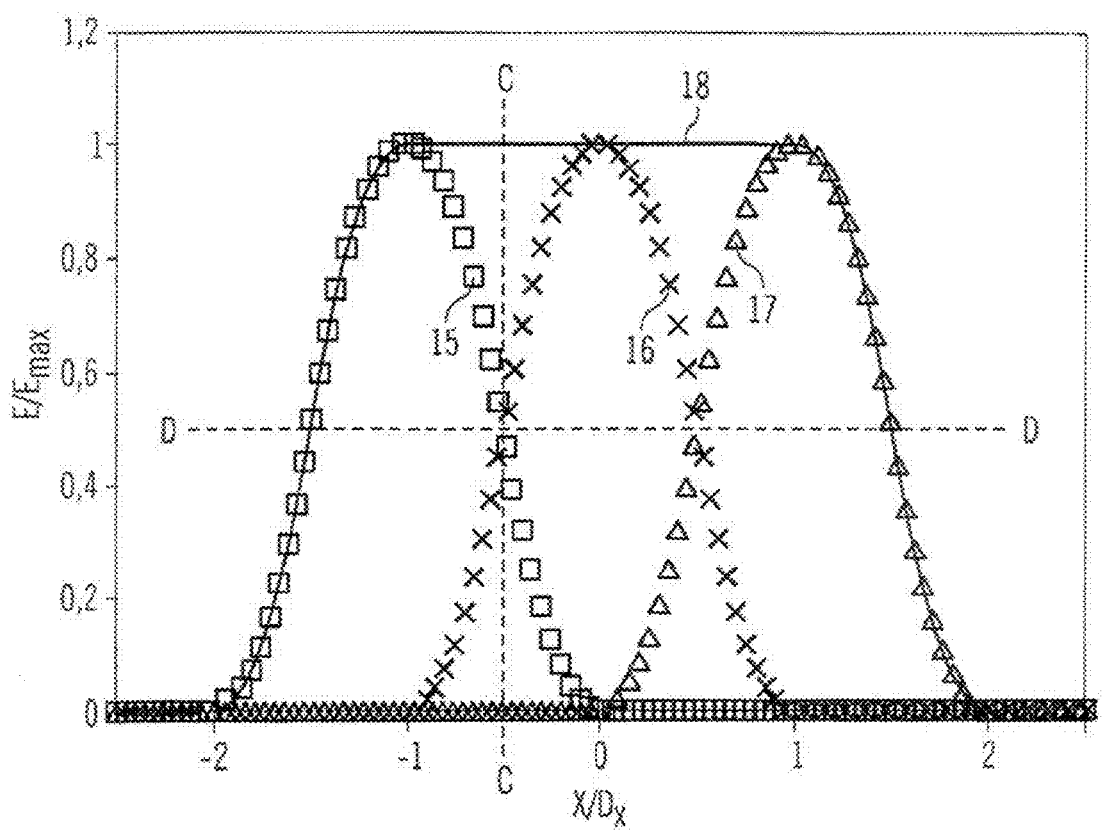
FIG. 13 shows the relative illumination intensity distribution of three optoelectronic components as shown in FIG. 12B along the line y=0.

By way of example, this is illustrated for the x-direction in FIG. 13. This figure shows the illumination intensities 15, 16, 17 of three optoelectronic components 1 which are adjacent along the x-direction, with these being the illumination intensities which are produced by the optoelectronic components 1 on the luminous area 12 of the illumination device 10.

By mirroring the illumination intensity 16 of one optoelectronic component 1 on a plane which is parallel to the optical axis 5, runs centrally between the adjacent components 1 and is perpendicular at the distance indicated by the line C-C in FIG. 12, the illumination intensity 15 of the adjacent component 1 is obtained. In other words, the beam cones of the adjacent components 1 are arranged with mirror-image symmetry with respect to this plane C-C.

In addition, the distance $D_x$ between the components 1 is chosen such that the illumination intensities 15, 16 and 16, 17 respectively of the mutually superimposed beam cones are symmetrical with respect to reflection on the surface D-D, which is parallel to the x-y plane and runs through the intersection of the illumination intensities of adjacent components. The respective illumination intensities 15, 16 and 16, 17 are advantageously added in this way to form a constant value, and a constant illumination intensity distribution 18 is achieved along the x-direction.

The components 1 are arranged in an analogous manner along the y-direction. Particularly as a result of the quadrant symmetry of the optoelectronic components 1, an essentially homogeneous illumination intensity distribution 18, that is to say an illumination intensity which in particular essentially is independent of the position on the luminous area 12, is achieved over the entire luminous area 12. The height of the illumination device 10, in other words the extent of the illumination device 10 perpendicular to the luminous area 12, is in this case only between 10 mm and 30 mm, with the limits being inclusive.

Figure 12A:
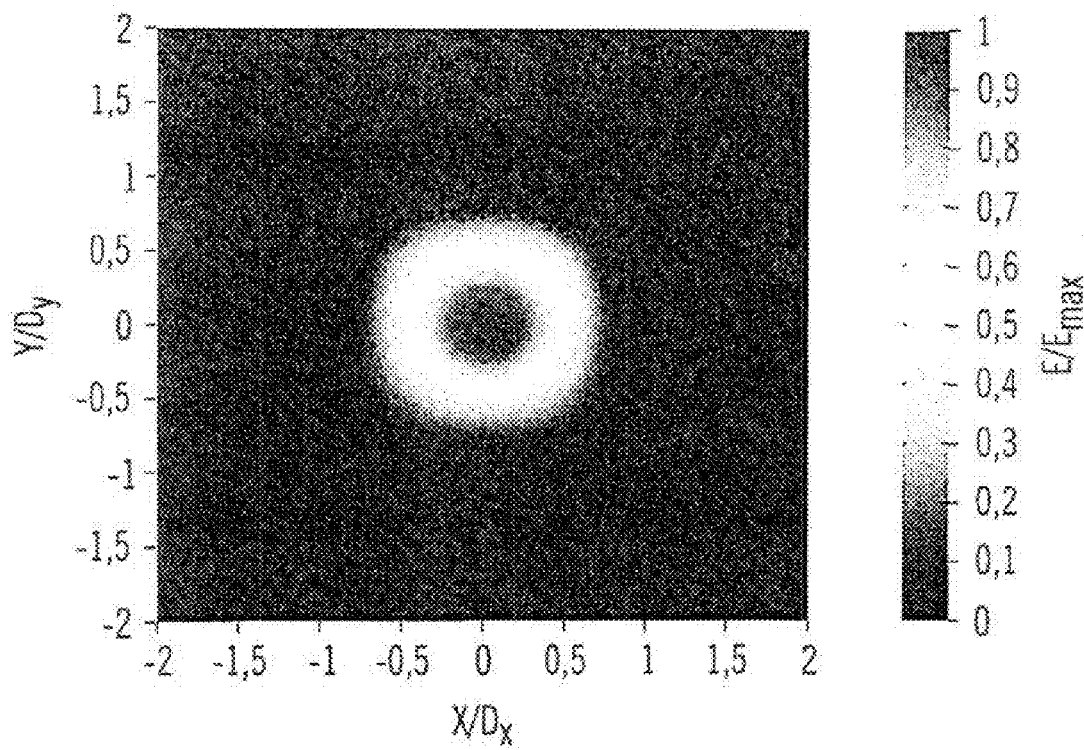
FIG. 12A shows the relative illumination intensity distribution of an optoelectronic component of the illumination apparatus according to the exemplary embodiment shown in FIG. 10.
Figure 12B:
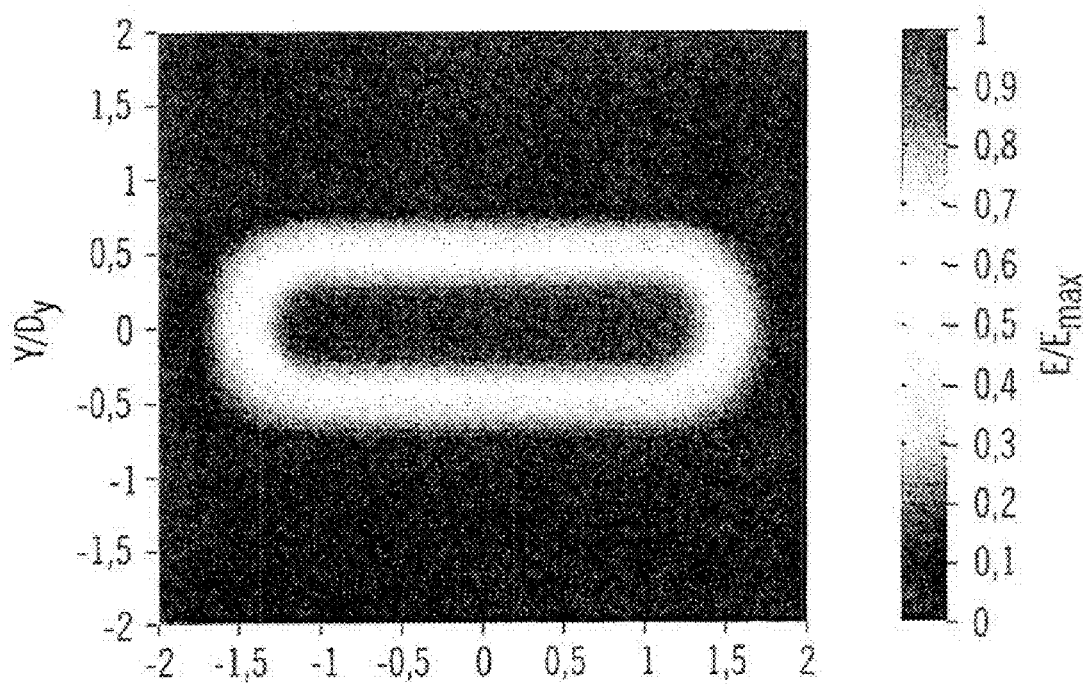
FIG. 12B shows the relative illumination intensity distribution of three adjacent components of the illumination device according to the exemplary embodiment shown in FIG. 10.

This is illustrated once again in FIGS. 12A to 12C. FIG. 12A shows the illumination intensity distribution 16 of a single optoelectronic component 1 in the illumination apparatus 10 in the form of a plain view of the luminous area 12. The axes are in this case normalized, both in the x-direction and in the y-direction, with respect to a respective side length $D_x$ and $D_y$ of the grid 14. The illumination intensity distribution 16 has a quadrant-symmetrical form on the plane of the paper, like the optically active region 100 of the component 1, and this differs slightly from a rotationally symmetrical form. The illumination intensity 16 is a maximum at the point 0.0, and decreases in the outward direction.

FIG. 12B shows the superimposition of the illumination intensities 15, 16, 17 of three optoelectronic components 1 which are adjacent in the x-direction. FIG. 13 corresponds to a "cross section" along the line y=0 in FIG. 12B. The beam cones of the components 1 are superimposed such that an illumination intensity 18 which is homogeneous along the x-direction is created on the luminous area 12. The illumination intensity $e_{i,j}(x,y)$ of a single component 1 in this case has, as described in the general part, a cosine-form profile where $e_{i,j}(x,y)=\{1+\cos [(x-x_i)/D_x*\pi]\} \cdot e_y(y-y_j) \cdot e_0$ for $x\in[x_i-D_x;x_i+D_x]$, or else $e_x(x)=0$.

FIG. 12C additionally shows how the illumination intensities 15, 16 17 of the three components 1 in FIG. 12B have superimposed on them the illumination intensities of the respectively adjacent components 1 in the y-direction. FIG. 12C therefore shows the area of the luminous area 12 which is illuminated by nine adjacent optoelectronic components 1. The optical axes 5 of the components are in this case perpendicular at the points with the relative coordinates (−1, −1), (−1, 0), (−1, 1), (0, −1), (0, 0), (0, 1), (1, −1), (1, 0), (1, 1). This clearly shows that a homogeneous illumination intensity distribution 18 is achieved over the entire illuminated area.

The illumination device 10 furthermore comprises side walls 11. As in the first exemplary embodiment shown in FIG. 9, the side walls 11 are designed to be reflective, in particular mirrored.

The side walls form a rectangle and are each parallel to the first axes 6 or the second axes 7 of the coordinate systems. In other words, the side walls run in the x-direction and y-direction, in particular parallel to the grid lines 6, 7 of the grid 14.

The distance of a side wall 11, which runs in the x-direction, to the adjacent grid line or the first axis 6, respectively, corresponds to half the length of a basic unit 140 of the grid 14 in the y-direction, that is to say $D_y/2$. Analogously, the distance between a side wall 11 which is parallel to the second axes 7 and the adjacent second axis 7 corresponds to half the grid interval in the x-direction, that is to say $D_x/2$. The side walls 11 therefore advantageously extend the periodicity of the grid. In this way, a homogeneous illumination intensity 18 is also achieved at the edge of the luminous area 12. The entire luminous area 12 of the illumination device 10 is preferably illuminated with an essentially homogeneous illumination intensity 18 during operation.

Figure 11:
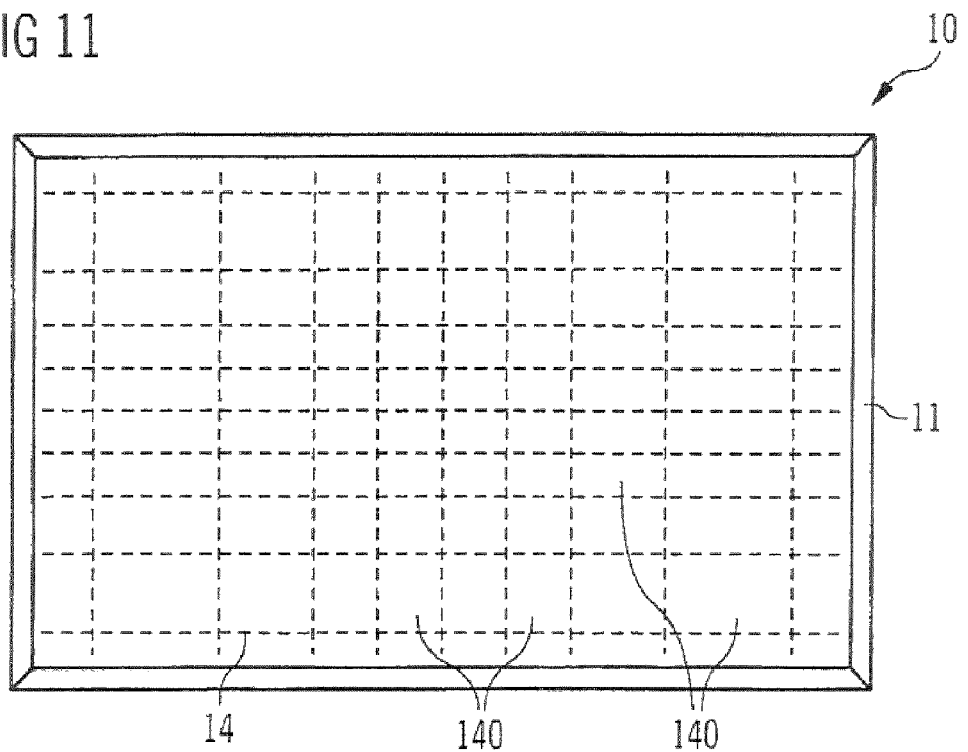
FIG. 11 shows an illumination device according to a third exemplary embodiment.

According to the third exemplary embodiment shown in FIG. 11, and in contrast to the previous exemplary embodiment, the illumination device 10 has a grid 14 which is distorted in an edge area of the illumination device 10 and is a rectangular grid in a central area of the illumination device. A distorted grid such as this allows the illumination intensity distribution to be individually adapted.

The description on the basis of the exemplary embodiments does not restrict the invention thereto. Rather, the invention covers any novel feature and any combination of features, in particular including any combination of features in the patent claims, even if this feature or this combination is not itself explicitly stated in the patent claims or exemplary embodiments.

The invention claimed is:

1. An optoelectronic component having an optically active region, wherein the optically active region comprises:
   at least one semiconductor chip operable to generate electromagnetic radiation, and
   a beam-forming element through which at least a portion of the electromagnetic radiation which is emitted from the semiconductor chip in operation passes and which has an optical axis, and
   wherein the optically active region has quadrant symmetry with respect to a coordinate system which is perpendicular to the optical axis
   wherein at least a part of the beam-forming element has quadrant symmetry, the beam-forming element comprises a lens having a flat radiation inlet surface and a curved, smooth radiation outlet surface, the radiation outlet surface adjoins the radiation inlet surface in a direction away from the semiconductor chip, and a cross-section of the lens narrows in the direction away from the semiconductor chip.

2. The optoelectronic component as claimed in claim 1, wherein the entire beam-forming element has quadrant symmetry.

3. The optoelectronic component as claimed in claim 1, wherein the part of the beam-forming element that has quadrant symmetry or the beam-forming element has a rectangular form whose corners are rounded, in a plan view along the optical axis.

4. The optoelectronic component as claimed in claim 1, wherein the radiation outlet surface comprises a central area, through which the optical axis passes and which has concave curvature, is planar or has slightly convex curvature.

5. The optoelectronic component as claimed in claim 4, wherein the central area has a rectangular form whose corners are rounded, in a plan view of the radiation outlet surface.

6. The optoelectronic component as claimed in claim 4, wherein the radiation outlet surface comprises an edge area which at least partially surrounds the central area at a distance from the optical axis, and has convex curvature.

7. The optoelectronic component as claimed in claim 6, wherein the edge area has a rectangular form whose corners are rounded, in a plan view of the radiation outlet surface.

8. The optoelectronic component as claimed in claim 1, wherein the optical axis passes through the at least one semiconductor chip.

9. The optoelectronic component as claimed in claim 8, wherein the at least one semiconductor chip has quadrant symmetry.

10. The optoelectronic component as claimed in claim 1, having a plurality of semiconductor chips, which are arranged such that they together have quadrant symmetry.

11. The optoelectronic component as claimed in claim 1, having a housing body in which the at least one semiconductor chip is arranged.

12. The optoelectronic component as claimed in claim 11, in which the beam-forming element is manufactured separately from the housing body, and is attached to it.

13. The optoelectronic component as claimed in claim 1, which comprises at least one semiconductor chip with an emission maximum in the red spectral range, at least one semiconductor chip with an emission maximum in the green spectral range, and/or at least one semiconductor chip with an emission maximum in the blue spectral range.

14. The optoelectronic component as claimed in claim 1, comprising a first semiconductor chip which emits electromagnetic radiation with a first spectral distribution during operation, and comprising a second semiconductor chip which emits electromagnetic radiation (4) with a second spectral distribution during operation.

15. The optoelectronic component as claimed in claim 14, comprising a third semiconductor chip which emits electromagnetic radiation (4) with a third spectral distribution during operation.

16. The optoelectronic component as claimed in claim 1, which emits light with a white color impression during operation.

17. An illumination device having an optoelectronic component as claimed in claim 1.

18. The illumination device as claimed in claim 17, having reflective side surfaces which surround the optoelectronic component and are arranged parallel to the optical axis of the beam-forming element.

19. The illumination device as claimed in claim 18, wherein the reflective side surfaces are arranged in a form of a rectangle or square in a plan view along the optical axis.

20. The illumination device as claimed in claim 17 having a plurality of optoelectronic components, whose optical axes are arranged essentially parallel to one another.

21. The illumination device as claimed in claim 20, wherein the optoelectronic components are arranged such that areas which are illuminated by adjacent components on a plane perpendicular to the optical axes intersect at least in places.

22. The illumination device as claimed in claim 20, wherein the optoelectronic components are arranged at the grid points of a grid.

23. The illumination device as claimed in claim 22, wherein the grid has basic units which are in the form of parallelograms, are rectangular or are square.

24. The illumination device as claimed in claim 20, comprising reflective side surfaces which are arranged parallel to the optical axes of the optoelectronic components and surround the optoelectronic components.

25. The illumination device as claimed in claims 23, wherein the reflective side surfaces run parallel to grid lines of the grid.

26. The illumination device as claimed in claim 25, wherein one side surface and one adjacent optoelectronic component are at a distance from one another which corresponds to half a side length of a basic unit of the grid.

27. The illumination device as claimed in claim 20, comprising a first optoelectronic component which emits electromagnetic radiation with a first spectral distribution during operation, and comprising a second optoelectronic component which emits electromagnetic radiation with a second spectral distribution during operation.

28. The illumination device as claimed in claim 27, comprising a third optoelectronic component which emits electromagnetic radiation with a third spectral distribution during operation.

29. The illumination device as claimed in claim 17, having at least one optoelectronic component which has an emission maximum in the red spectral range, at least one optoelectronic component which has an emission maximum in the green spectral range, and/or at least one optoelectronic component which has an emission maximum in the blue spectral range.

30. The illumination device as claimed in claim 1, which emits light with a white color impression during operation.

31. The illumination device as claimed in claim 17, comprising a diffuser surface, through which at least a part of the radiation which is emitted from the optoelectronic component or from the optoelectronic components is output.

32. The illumination device as claimed in claim 31, wherein the diffuser surface is homogeneously back-lit by the optoelectronic component or by the optoelectronic components.

33. The illumination device as claimed in claim 17, which is a back-lighting apparatus.

34. An optoelectronic component having an optically active region, wherein the optically active region comprises:
at least one semiconductor chip which is provided for generating electromagnetic radiation, and
a lens through which at least a portion of the electromagnetic radiation which is emitted from the semiconductor chip in operation passes and which has an optical axis, and has a quadrant symmetry with respect to a coordinate system which is perpendicular to the optical axis;
wherein the lens has a flat radiation inlet surface and a curved, smooth radiation outlet surface, the radiation outlet surface has a central area and an edge area, the edge area completely laterally surrounds the central area when viewed along the optical axis, the central area is concavely curved and the edge area has a convex curvature, the edge area adjoins the radiation inlet surface in such fashion that an interface of the edge area and the radiation inlet surface represents an outer contour of the lens when viewed along the optical axis.

* * * * *

UNITED STATES PATENT AND TRADEMARK OFFICE
CERTIFICATE OF CORRECTION

PATENT NO. : 8,172,433 B2  Page 1 of 1
APPLICATION NO. : 12/305491
DATED : May 8, 2012
INVENTOR(S) : Julius Muschaweck It is certified that error appears in the above-identified patent and that said Letters Patent is hereby corrected as shown below:

Cover page, item (56) References Cited, column 2, line 14, delete "CN 169396" and insert -- CN 1693969 --.

In Claim 14, column 16, line 29, delete "radiation (4)" and insert -- radiation --.

In Claim 15, column 16, line 33, delete "radiation (4)" and insert -- radiation --.

In Claim 25, column 16, line 65, delete "claims" and insert -- claim --.

Signed and Sealed this
Tenth Day of July, 2012

David J. Kappos
*Director of the United States Patent and Trademark Office*